US012625193B2

(12) United States Patent
Sestok, Iv et al.

(10) Patent No.: US 12,625,193 B2
(45) Date of Patent: **\*May 12, 2026**

(54) DROOP COMPENSATION FOR DEVICE UNDER TEST SPECTROSCOPY

(71) Applicant: Texas Instruments Incorporated, Dallas, TX (US)

(72) Inventors: Charles Kasimer Sestok, Iv, Dallas, TX (US); David Patrick Magee, Allen, TX (US)

(73) Assignee: TEXAS INSTRUMENTS INCORPORATED, Dallas, TX (US)

( \* ) Notice: Subject to any disclaimer, the term of this patent is extended or adjusted under 35 U.S.C. 154(b) by 125 days.

This patent is subject to a terminal disclaimer.

(21) Appl. No.: 18/472,542

(22) Filed: Sep. 22, 2023

(65) Prior Publication Data

US 2024/0012062 A1       Jan. 11, 2024

Related U.S. Application Data

(63) Continuation of application No. 17/463,186, filed on Aug. 31, 2021, now Pat. No. 11,768,250.

(60) Provisional application No. 63/148,638, filed on Feb. 12, 2021.

(51) Int. Cl.
| | |
|---|---|
| *G01R 31/389* | (2019.01) |
| *G01R 31/3835* | (2019.01) |
| *G01R 31/396* | (2019.01) |

(52) U.S. Cl.
CPC ....... *G01R 31/389* (2019.01); *G01R 31/3835* (2019.01); *G01R 31/396* (2019.01)

(58) Field of Classification Search
None
See application file for complete search history.

(56) References Cited

U.S. PATENT DOCUMENTS

| | | | |
|---|---|---|---|
| 11,768,250 B2 * | 9/2023 | Sestok, IV | ........... G01R 31/389 |
| | | | 324/430 |
| 2003/0202573 A1 * | 10/2003 | Yamaguchi | ............ G01R 29/26 |
| | | | 375/226 |
| 2012/0032688 A1 | 2/2012 | Christophersen et al. | |
| 2021/0104896 A1 | 4/2021 | Chae et al. | |

\* cited by examiner

*Primary Examiner* — Jas A Sanghera

(74) *Attorney, Agent, or Firm* — Zhenhai Fu; Frank D. Cimino

(57) ABSTRACT

A method includes transforming a signal from a first domain representation to a second domain representation, the signal representing a parameter of a device and having multiple cycles. The method further comprises determining the second domain representation of a droop component of the parameter based on the signal, in which the droop component represents a rate of change of the parameter across one or more cycles of the multiple cycles. The method further comprises generating an adjusted parameter of the device based on combining the respective second domain representations of the parameter and the droop component.

22 Claims, 6 Drawing Sheets

600

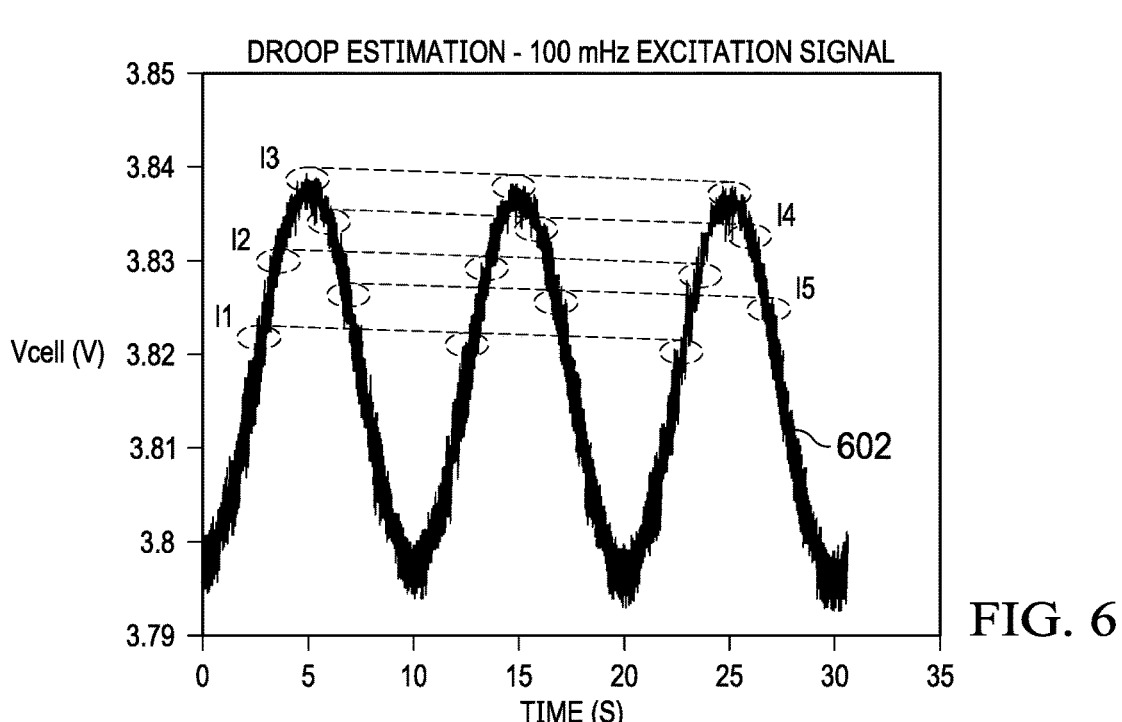

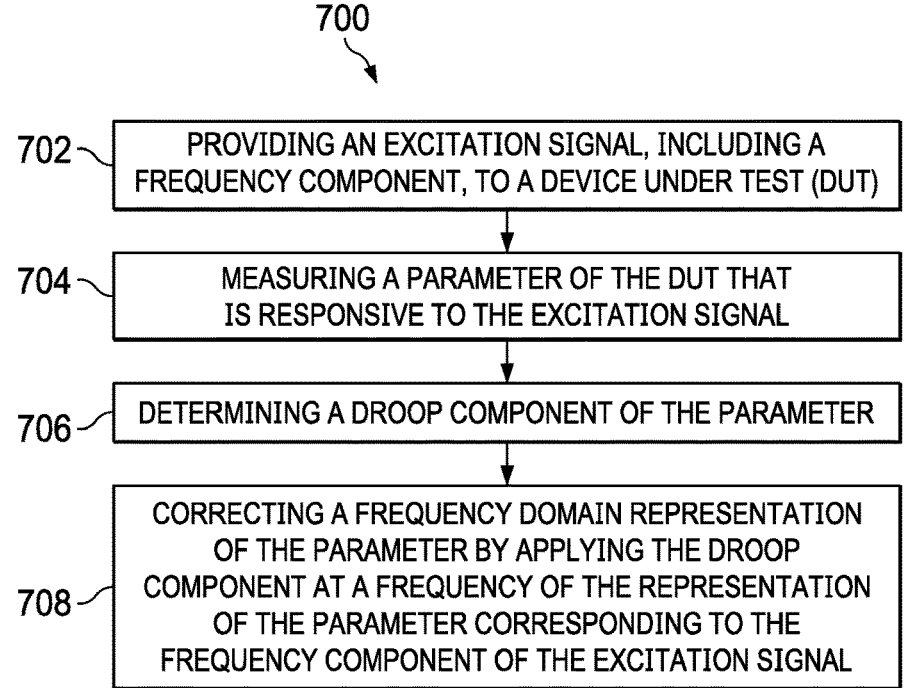

702 — PROVIDING AN EXCITATION SIGNAL, INCLUDING A FREQUENCY COMPONENT, TO A DEVICE UNDER TEST (DUT)

704 — MEASURING A PARAMETER OF THE DUT THAT IS RESPONSIVE TO THE EXCITATION SIGNAL

706 — DETERMINING A DROOP COMPONENT OF THE PARAMETER

708 — CORRECTING A FREQUENCY DOMAIN REPRESENTATION OF THE PARAMETER BY APPLYING THE DROOP COMPONENT AT A FREQUENCY OF THE REPRESENTATION OF THE PARAMETER CORRESPONDING TO THE FREQUENCY COMPONENT OF THE EXCITATION SIGNAL

DROOP COMPENSATION -
1 Hz EXCITATION SIGNAL

INITIAL Vcell DATA
COMPENSATED Vcell DATA 15 dB INTERFERENCE REDUCTION

Vcell
(dBV)

FREQUENCY (Hz)

900

MEASURED IMPEDANCE, SINGLE-TONE SWEEP

-Im(Z) (mΩ)

100 mHz 100 mHz

DROOP COMPENSATION ON
DROOP COMPENSATION OFF

Re(Z) (mΩ)

DROOP COMPENSATION FOR DEVICE UNDER TEST SPECTROSCOPY

CROSS-REFERENCE TO RELATED APPLICATIONS

The present application is a continuation of U.S. patent application Ser. No. 17/463,186, filed Aug. 31, 2021, titled "Droop Compensation For Device Under Test Spectroscopy", and claims priority to U.S. Provisional Patent Application No. 63/148,638, filed Feb. 12, 2021, titled "Voltage Droop Compensation For Battery Electrochemical Impedance Spectroscopy," both of which are incorporated herein by reference in their entireties.

BACKGROUND

Spectroscopy measures device under test (DUT) response spectra to characterize behavior of the DUT as a function of frequency. One type of spectroscopy is electrochemical impedance spectroscopy (EIS), in which the DUT is a battery cell or a group of battery cells, and the measured response is battery impedance.

SUMMARY

In an example of this description, a method includes determining a droop component of a measured parameter of a device under test (DUT). The measured parameter is responsive to an excitation signal having a frequency component, and the droop component is determined responsive to a first value of the parameter at a first time and a second value of the parameter at a second time. The parameter at the first time has a first phase value, and the parameter at the second time has a second phase value. The first phase value is equal to the second phase value. The method also includes correcting a frequency domain representation of the parameter by applying the droop component at a frequency of the representation of the parameter corresponding to the frequency component of the excitation signal.

In another example of this description, a system includes a droop estimation circuit configured to determine a droop component of a parameter. The parameter is responsive to an excitation signal provided to a device under test (DUT), and the excitation signal includes a frequency component. The droop component is determined responsive to a first value of the parameter at a first time and a second value of the parameter at a second time. The parameter at the first time has a first phase value, and the parameter at the second time has a second phase value. The first phase value is equal to the second phase value. The system also includes a droop correction circuit coupled to the droop estimation circuit. The droop correction circuit is configured to correct a frequency domain representation of the parameter by applying the droop component at a frequency of the representation of the parameter corresponding to the frequency component of the excitation signal.

In yet another example of this description, a non-transitory, computer-readable medium contains instructions that, when executed by a processor, cause the processor to be configured to determine a droop component of a measured parameter of a device under test (DUT). The measured parameter is responsive to an excitation signal that includes a frequency component, and the droop component is determined responsive to a first value of the parameter at a first time a second value of the parameter at a second time. The parameter at the first time has a first phase value, and the parameter at the second time has a second phase value. The first phase value is equal to the second phase value. The instructions, when executed by the processor, also cause the processor to be configured to correct a frequency domain representation of the parameter by applying the droop component at a frequency of the representation of the parameter corresponding to the frequency component of the excitation signal.

BRIEF DESCRIPTION OF THE DRAWINGS

FIG. 6 is a graph of a waveform of a measured parameter of a device under test, which demonstrates estimations of a droop component using multiple sample lines in an example.

FIG. 7 is a flow chart of a method of compensating for a droop component in a measured parameter of a device under test in an example.

DETAILED DESCRIPTION

In some cases, circuit models approximate electrical device behavior. One such electrical device is a battery cell or group of battery cells, referred to herein as a battery for simplicity. In some cases, rechargeable batteries power various portable devices, such as laptop computers, mobile phones, and electric vehicles (EVs), as well as provide supplemental energy for power grids. The ability to predict battery behavior while the battery provides a current is useful to control and regulate power provided to such devices. A useful battery model accurately predicts voltage, current, and state-of-charge (SOC) while environmental conditions (e.g., temperature, pressure, humidity) vary, and the battery undergoes charging and discharging cycles.

Battery behavior while providing a current to a load depends on battery condition and environmental conditions. The battery condition can be characterized by its SOC, which refers to the level of available charge in the battery, and by its state-of-health (SOH), which refers to an amount (e.g., a percentage) of useful charge/discharge cycles remaining compared to the expected charge/discharge cycles that the battery is capable of. Environmental conditions including temperature (T), pressure and humidity also impact battery behavior.

Figures 1, 4:
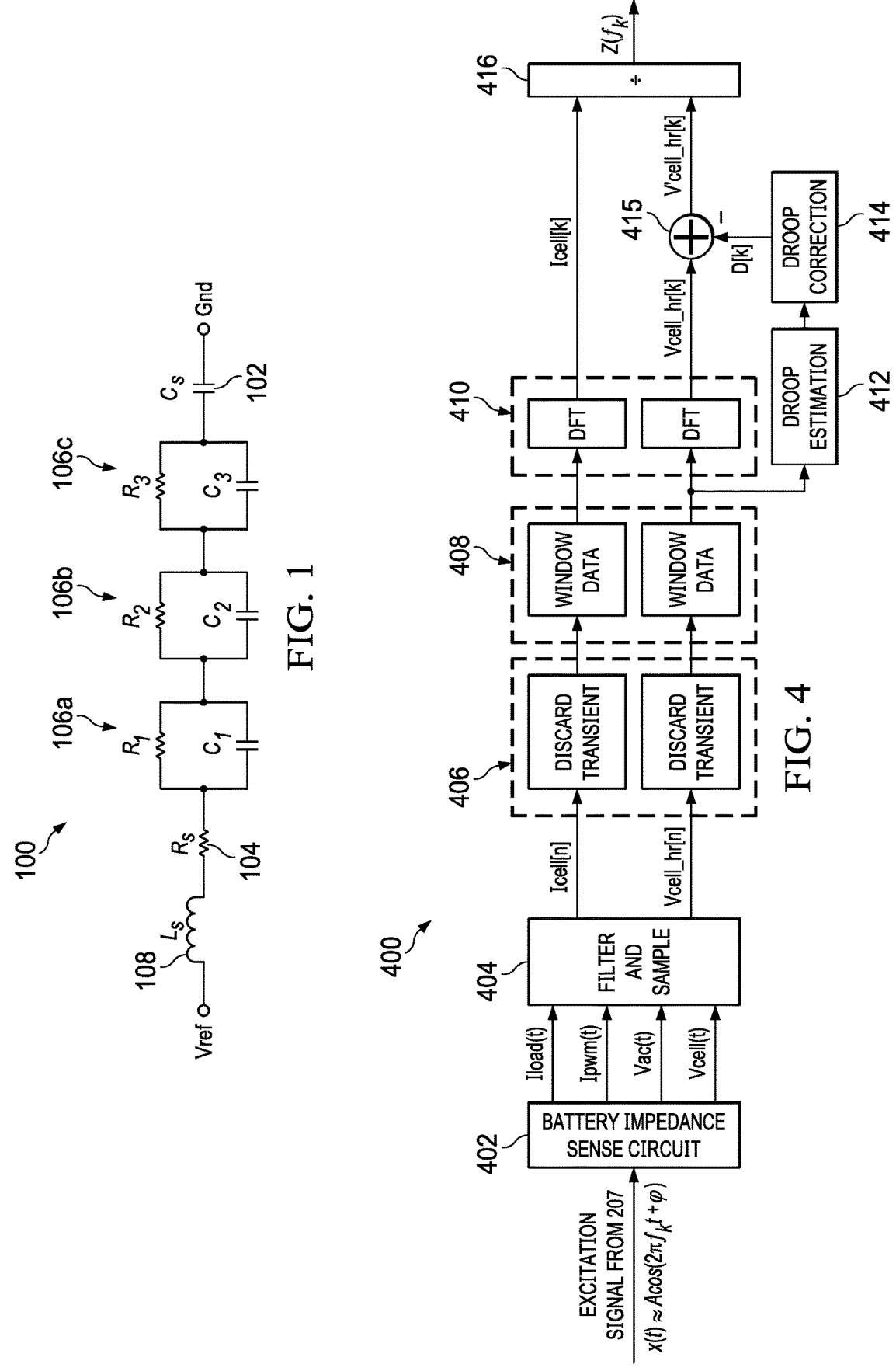
FIG. 1 is a model circuit diagram of a device under test, such as a battery, in an example.
FIG. 4 is a block diagram of a system to compensate for a droop component in a measured parameter of a device under test in an example.

FIG. 1 is a circuit diagram of a model 100 of a DUT, which is a battery in this example. In the example of FIG. 1, the model 100 includes a series combination of a capacitor 102, a resistor 104, and three resistor-capacitor (RC) stages 106. Each RC stage 106 includes a resistor and a capacitor in parallel. In some cases, the model 100 also includes a series inductor 108. In other cases, the model 100 may include five RC stages 106, fewer than three RC stages, or other numbers of RC stages 106. In the example of FIG. 1, the inductor 108 is coupled to a reference voltage terminal, the voltage at which is given by Vref. The inductor 108 is also coupled to the resistor 104, which is also coupled to a first RC stage 106a. The first RC stage 106a is coupled to a second RC stage 106b, which is also coupled to a third RC stage 106c. The third RC stage 106c is also coupled to the capacitor 102, which is also coupled to a ground node, the voltage at which is given by Gnd.

The series capacitor 102 represents a charge stored in the battery represented by the model 100. The series resistor 104 represents a high-frequency resistance of the battery represented by the model 100. Each RC stage 106 represents a time constant for the variation of instantaneous voltage of the battery represented by the model 100. The series inductor 108 represents board parasitics, as well as wiring from board to the battery represented by the model 100.

In examples of this description, EIS is useful to estimate an impedance of each battery cell at a given operating condition, which can depend on the SOC, the temperature, and the age of the cell. In some cases, excitation signals are applied to the battery (or DUT) represented by the model 100 to determine its impedance. The excitation signals can be applied across a range of operating conditions, and are useful to estimate the circuit parameters of the model 100, which reflect the measured responses of the battery represented by the model 100.

In examples of this description, the battery cell SOC, SOH, and internal temperature are correlated to an impedance spectrum of the battery. The impedance spectrum for a battery is the ratio between the battery cell voltage and current in the frequency domain. As described, EIS is useful to measure battery impedance spectra to characterize the behavior of the battery. Accordingly, the cell SOC, SOH, or temperature are inferred from EIS measurements (e.g., from the measured impedance).

Figure 2:
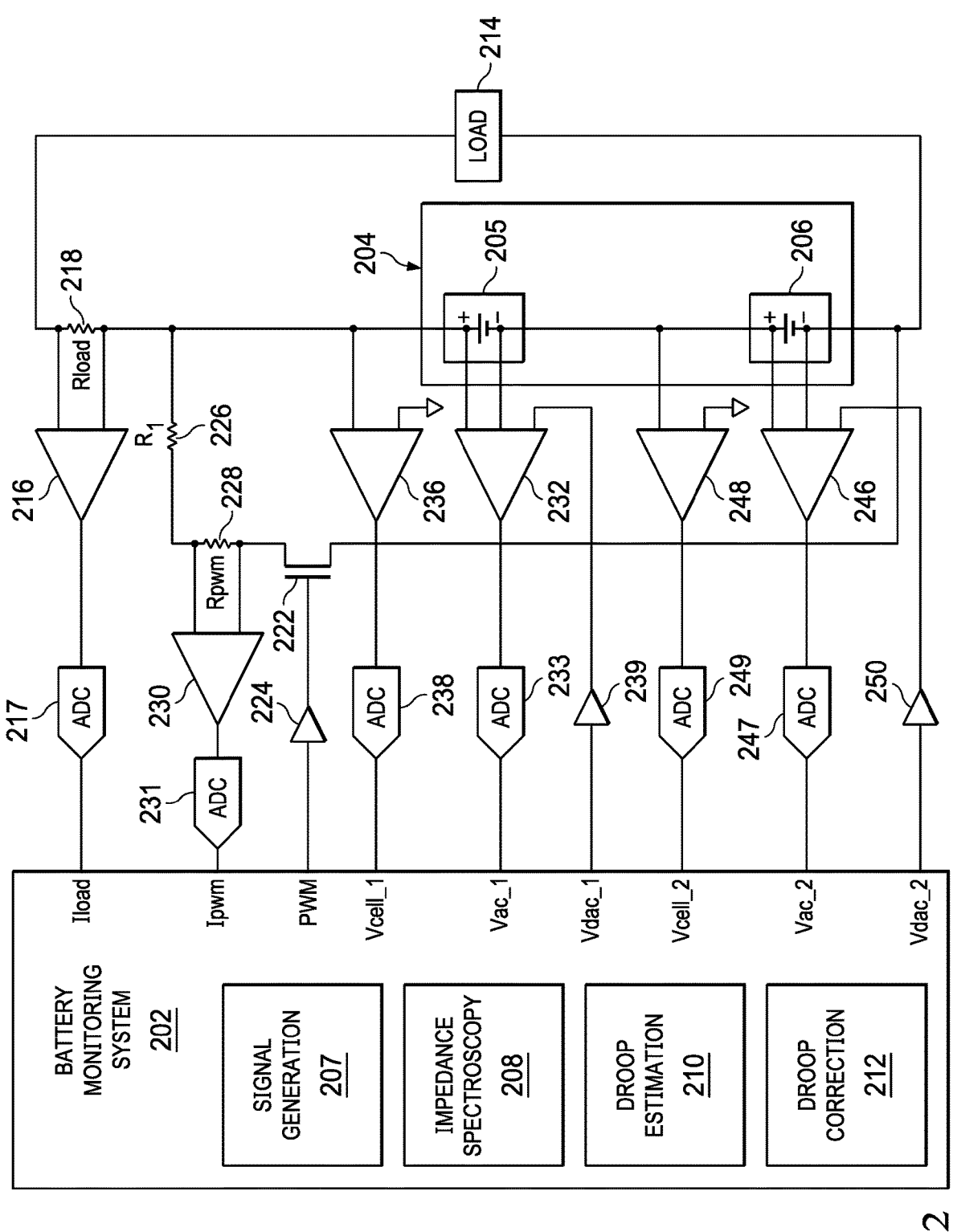
FIG. 2 is a circuit diagram of a battery monitoring system coupled to battery logical cells in an example.

FIG. 2 is a circuit diagram of a system 200, including a battery monitoring system 202 coupled to a battery pack 204 containing two cells 205, 206 in an example. In other examples, the battery pack 204 contains as many as 16 or 24 cells connected in series. Each cell 205, 206 that is connected in series can contain multiple cells in parallel, with each such set of cells connected in parallel forming a logical cell 205, 206. Accordingly, in the example of FIG. 2, the DUT is the battery pack 204. However, other examples of this description apply to a DUT other than a battery pack 204.

The battery monitoring system 202 is configured to provide one or more excitation signals to the battery pack 204 (e.g., the DUT) and also to acquire one or more response signals from the battery pack 204, which correspond to parameter(s) being measured. As described below, the excitation signal(s) include a frequency component.

The battery monitoring system 202 includes signal generation circuit 207, which is configured to cause the excitation signals to be provided to the battery pack 204. The battery monitoring system 202 also includes impedance spectroscopy circuit 208, which is configured to determine an impedance result, or spectra, of the battery pack 204, such as based on a ratio of a measured or provided battery pack 204 voltage signal and a measured or provided battery pack 204 current signal. The battery monitoring system 202 also includes droop estimation circuit 210 and droop correction circuit 212, which are described below.

Each of the signal generation circuit 207, the impedance spectroscopy circuit 208, the droop estimation circuit 210, and the droop correction circuit 212 can be implemented in hardware (e.g., one or more application-specific integrated circuits (ASICs)), as software executed by a hardware processor, or a combination of software and hardware. For example, the battery monitoring system 202 includes a hardware processor configured to execute instructions (e.g., stored in a non-transitory, computer-readable medium, such as a memory). Responsive to the processor executing the instructions, the processor is configured to perform the functionality described herein, including droop estimation and droop correction. The scope of the examples of this description is not limited to a particular physical implementation of any of the circuit of the battery monitoring system 202.

In the example of FIG. 2, the battery pack 204 is coupled to a load 214, which is an inverter to control a motor in an EV in one example. A load current amplifier 216 is configured to receive a voltage across a load current sense resistor 218 (e.g., the load current amplifier 216 has a first input coupled to a first terminal of the load current sense resistor 218 and a second input coupled to a second terminal of the load current sense resistor 218), and to provide a voltage at its output that is proportional to the voltage across the load current sense resistor 218. Accordingly, the voltage provided at the output of the load current amplifier 216 is also proportional to the current provided to the load 214 by the battery pack 204, and the battery monitoring system 202 receives the voltage provided at the output of the load current amplifier 216 as signal Iload. In some examples, the output of the load current amplifier 216 is provided to an analog-to-digital converter (ADC) 217, which converts the analog output of the load current amplifier 216 to a digital value. In these examples, the battery monitoring system 202 receives the digital value output of the ADC 217 as Iload.

The battery monitoring system 202 is configured to generate a pulse-width modulation (PWM) signal, labeled PWM, to control a transistor 222. For example, the transistor 222 is a field-effect transistor (FET) 222 and the PWM signal controls a gate driver 224, which drives a gate of the FET 222 responsive to the PWM signal. A current measurement path is formed through resistor 226 (having a resistance R1) and PWM current sense resistor 228 (having a resistance Rpwm) responsive to the PET 222 conducting (e.g., being on/closed). No current flows through the current measurement path responsive to the FET 222 not conducting (e.g., responsive to the PET being off/open).

A current measurement amplifier 230 is configured to receive a voltage across the PWM current sense resistor 228 (e.g., the current measurement amplifier 230 has a first input coupled to a first terminal of the PWM current sense resistor 228 and a second input coupled to a second terminal of the PWM current sense resistor 228), and to provide a voltage at its output that is proportional to the voltage across the PWM current sense resistor 228. Accordingly, the voltage provided at the output of the current measurement amplifier 230 is also proportional to the current through the current measurement path, including resistors 226, 228, and the battery monitoring system 202 receives the voltage provided at the output of the current measurement amplifier 230 as signal Ipwm. In some examples, the output of the current measurement amplifier 230 is provided to an ADC 231, which converts the analog output of the current measurement amplifier 230 to a digital value. In these examples, the battery monitoring system 202 receives the digital value output of the ADC 231 as Ipwm.

A battery voltage amplifier 232 is configured to receive an alternating current (AC) voltage across the battery cell 205 (e.g., the battery voltage amplifier 232 has a first input coupled to a first terminal of the battery cell 205 and a second input coupled to a second terminal of the battery cell 205), and to provide a voltage at its output that is proportional to the voltage across the battery cell 205. The battery monitoring system 202 receives the voltage provided at the output of the battery voltage amplifier 232 as signal Vac_1. In some examples, the output of the battery voltage amplifier 232 is provided to an ADC 233, which converts the analog output of the battery voltage amplifier 232 to a digital value. In these examples, the battery monitoring system 202 receives the digital value output of the ADC 233 as Vac_1. A second battery voltage amplifier 236 is configured to receive a direct current (DC) voltage at the positive terminal of the battery cell 205 and to provide a voltage at its output that is proportional to the nominal voltage at this location in the battery pack 204. In some examples, the output of the second battery voltage amplifier 236 is provided to an ADC 238, which converts the analog output of the second battery voltage amplifier 236 to a digital value. In these examples, the battery monitoring system 202 receives the digital value output of the ADC 238 as Vcell_1. In one example, the battery monitoring system 202 is also configured to provide an offset voltage as signal Vdac_1 to an offset input of the battery voltage amplifier 232 (e.g., using a driver 239 in FIG. 2). The battery monitoring system 202 determines the Vdac1 signal level responsive to the root mean square (RMS) value of the Vcell_1 signal.

In an example in which the battery pack 204 includes an additional battery cell 206, a third battery voltage amplifier 246 is configured to receive a voltage across the battery cell 206 in a like manner as the battery voltage amplifier 232 receives the voltage across the battery cell 205, as described. The battery monitoring system 202 thus receives the voltage provided at the output of the third battery voltage amplifier 246 as signal Vac_2. In some examples, the output of the third battery voltage amplifier 246 is provided to an ADC 247, which converts the analog output of the third battery voltage amplifier 246 to a digital value. In these examples, the battery monitoring system 202 receives the digital value output of the ADC 247 as Vac_2. A fourth battery voltage amplifier 248 is configured to receive a DC voltage at the positive terminal of the battery cell 206 and to provide a voltage at its output that is proportional to the nominal voltage at this location in the battery pack 204. In some examples, the output of the fourth battery voltage amplifier 248 is provided to an ADC 249, which converts the analog output of the fourth battery voltage amplifier 248 to a digital value. In these examples, the battery monitoring system 202 receives the digital value output of the ADC 249 as Vcell_2. In some examples, the battery monitoring system 202 is also configured to provide an offset voltage as signal Vdac_2 to an offset input of the third battery voltage amplifier 246 (e.g., using a driver 250 in FIG. 2). As described, the battery monitoring system 202 determines the Vdac_2 signal level responsive to the RMS value of the Vcell_2 signal.

As described, the battery monitoring system 202 is configured to provide one or more excitation signals to the battery pack 204 (e.g., the DUT). For example, the signal generation circuit 207 provides the PWM signal that controls the operation of the FET 222, which regulates current through the current measurement path including resistors

226, 228. The current through the current measurement path is drawn from the battery pack 204 (e.g., the cells 205, 206 in the example of FIG. 2).

The signal generation circuit 207 is configured to control a duty cycle of the FET 222 to regulate an amount of current through the current measurement path. A duty cycle of 100% corresponds to the PET 222 being always closed, and a duty cycle of 0% corresponds to the FET 222 being always open. The average current through the current measurement path is approximately equal to the duty cycle multiplied by the battery pack 204 voltage, divided by the sum of R1 and Rpwm (as well as any trace resistance along the current measurement path, which is ignored below for simplicity). Accordingly, the signal generation circuit 207, through the generation of the PWM signal, is configured to vary the average current drawn from the battery pack 204 between zero (e.g., responsive to a 0% duty cycle) and the battery pack 204 voltage divided by the sum of R1 and Rpwm (e.g., responsive to a 100% duty cycle). The current through the resistors 226, 228 is in addition to the current provided by the battery pack 204 to the load 214.

As described, the battery monitoring system 202 receives an indication of the current through the resistors 226, 228 as the output of the current measurement amplifier 230 (Ipwm). The battery monitoring system 202 is also configured to acquire one or more response signals from the battery pack 204, which correspond to parameter(s) being measured. For example, the Vac_1 signal provided by the battery voltage amplifier 232 corresponds to the AC voltage across the battery pack 204. Accordingly, the battery monitoring system 202 is configured to provide an excitation signal to the battery pack 204, such as by varying the current through the resistors 226, 228 by controlling the duty cycle of the PET 222 over time. The battery monitoring system 202 is also configured to measure a parameter (e.g., the voltage across the battery pack 204) that is responsive to the excitation signal.

The battery monitoring system 202 receives the indication of the current excitation signal (Ipwm) and the indication of the measured battery pack 204 AC voltage parameter(s) (Vac_1, Vac_2) in the time domain. The battery monitoring system 202 reconstructs the current and voltage across the battery cell 205, 206 responsive to Ipwm, and Vac_1 or Vac_2, respectively. For example, a high-resolution voltage for battery cell 205 can be determined as:

$$V_{cell\_hr\_1}[n] = V_{dac\_1}[n] + V_{ac\_1}[n] \tag{1}$$

For each time sample n. Likewise, the current for battery cells 205, 206 can be written as:

$$I_{cell}[n] = -(I_{load}[n] + I_{pwm}[n]) \tag{2}$$

For each time sample n. Similar values for the battery cell 206 (e.g., Vcell_hr_2[n]) can be determined according to Equation 1 by using the corresponding values (e.g., Vdac_2 and Vac_2) for the battery cell 206. In this description, positive current indicates a current flowing into the battery pack 204, and thus negative current indicates a current flowing out of the battery pack 204. In some examples, a mathematical transform, such as a discrete Fourier transform (DFT), is useful to analyze indications such as Vcell_hr_1, Ipwm, Vac_1, and Vac_2 (e.g., as EIS measurements) in the frequency domain, such as to compare the current and voltage signals in the frequency domain. A DFT of each the time domain current and voltage signals (e.g., Ipwm, and Vcell_hr_1 (for battery cell 205) or Vcell_hr_2 (for battery cell 206)) is performed using a number of samples (e.g., n) of the time domain signals. The results of these DFTs are frequency domain representations of the current and voltage signals. The impedance for the battery cell 205 at each discrete frequency index k is computed responsive to the frequency domain representations of the current and voltage signals:

$$Z_{cell\_1}[k] = \frac{V_{cell\_hr\_1}[k]}{I_{cell}[k]} \tag{3}$$

In an example that implements a DFT, the DFT can be computed relatively efficiently responsive to samples acquired by the battery monitoring system 202. For example, the DFT recovers underlying response spectra provided that the sampling rate exceeds twice the signal bandwidth and the measured signals are periodic, such that the duration of the DFT window 408 is a multiple of the period of the measured signal.

In an example in which the measured signals (e.g., the Ipwm signal from the current measurement amplifier 230, and the Vcell_hr_1 signal or the Vcell_hr_2 from the amplifiers 236, 248 respectively) are sinusoidal, and a sampled data interval covers an integer number of periods, a single frequency range (e.g., a single DFT frequency bin) is sufficient to represent and characterize the measured signals. However, in an example in which current is drawn from the battery pack 204 to conduct the measurements, the corresponding peak-to-peak cell voltage is not constant during the measurement. For example, in the equivalent circuit model 100 for the battery pack 204, the voltage across the series capacitor 102 decreases as the battery pack 204 discharges. Accordingly, the voltage signal(s) Vcell_hr_1, Vcell_hr_2 are not periodic. A DFT of this non-periodic signal results in spectral energy being distributed across multiple frequency ranges, or frequency bins. The presence of non-zero components in multiple frequency ranges, or frequency bins, is referred to as spectral leakage.

In an example, the battery monitoring system 202 is configured to control the FET 222 to provide a sinusoidal current excitation signal to the battery pack 204. In one example, the current excitation signal is a single sinusoidal signal (e.g., the excitation signal is a single-tone signal and has a single frequency component). In another example, the current excitation signal is a linear combination of sinusoidal signals (e.g., the excitation signal is a multi-tone signal and has multiple frequency components). Irrespective of whether the excitation signal has a single or multiple frequency components, those frequency components correspond to frequency ranges of the result of the transform to the frequency domain. For example, the frequency components each correspond to a DFT frequency bin.

The battery monitoring system 202 is configured to perform a transform to the frequency domain, such as a DFT, on the measured current excitation signal (e.g., the Ipwm signal) and on the voltage response signal (e.g., the Vcell_hr_1 signal). In one example, the impedance spectroscopy circuit 208 includes dedicated hardware to perform the DFT. In another example, the battery monitoring system 202 includes a hardware processor configured to execute instructions (e.g., stored in a non-transitory, computer-readable medium, such as a memory). Responsive to the processor executing the instructions, the processor is configured to perform the DFTs. The ratio of the voltage DFT (or transform) to the current DFT (or transform) is the battery pack 204 impedance spectra (e.g., an EIS measurement), which is useful to characterize the behavior of the battery pack 204. As described, the SOC, SOH, or T parameters can be inferred from the EIS measurement of the battery pack 204. The circuit parameters for the model 100 are then able to be determined or estimated responsive to the inferred parameters. Spectral leakage in the voltage and/or current DFT reduces the accuracy of the determination of the battery pack 204 impedance spectra, or EIS measurements, and subsequent processing of those EIS measurements.

In FIG. 1, the series capacitor 102 represents the charge storage of the battery pack 204, and is charged to the open circuit voltage (OCV) of the battery pack 204. As the battery pack 204 is discharged, the voltage on the series capacitor 102 in the model 100 decreases linearly with a slope that is determined by the capacitance of the capacitor 102 and the average current drawn from the battery pack 204. As described, the battery monitoring system 202 provides a sinusoidal current excitation signal to the battery pack 204, and the resulting voltage response signal is superimposed on the declining OCV (e.g., once a period of time has elapsed sufficient to allow transient response(s) associated with RC stage(s) 106 to settle). Because the OCV decreases over time as the battery pack 204 is discharged, the current excitation signal (which depends on the battery pack 204 voltage) and the voltage response signal include a droop component, and thus are not periodic. Accordingly, the voltage and/or current DFTs include spectral leakage.

In an example, the variation of the battery pack 204 OCV during measurement by the battery monitoring system 202 (e.g., voltage droop) is modeled as a linear variation superimposed on the single-tone or multi-tone voltage response signal produced by providing the current excitation signal to the battery pack 204. The effect of the voltage droop in the time domain is represented by a linear voltage ramp approximating the voltage droop behavior. In the frequency domain, the amount of spectral leakage is proportional to the slope of the linear ramp approximation. For example, for relatively small current excitation signals and a short measurement time, the resulting voltage droop signal varies slowly, which results in a relatively small negative slope for the voltage ramp. In one example, the amplitude of the current excitation signal is on the order of 100 milliamps (mA), and the frequency of the current excitation signal is approximately 1 millihertz (mHz), which results in a 1,000-second period. In this example, the measurement time is approximately three periods, or 3,000 seconds. A resulting slope of the voltage ramp can be approximately 10 microvolts (uV)/second. Accordingly, the frequency content of the voltage ramp falls primarily in a narrow frequency band, which is close to DC in the frequency domain (e.g., DFT bin zero). For longer measurement times (e.g., greater than three periods), the total change in the voltage ramp (e.g., droop) for the duration of the impedance measurement is also greater. Accordingly, for longer measurement times, the frequency content of the voltage droop falls in a broader band around DC in the frequency domain. The droop component is thus a source of interference for lower-frequency excitation signals (e.g., having frequency content that falls in similar, lower-frequency DFT bins, such as near DC in the frequency domain).

Examples of this description address the foregoing by determining a droop component in a measured parameter of a DUT (e.g., the measured parameter is responsive to providing an excitation signal to the DUT). In an example in which the DUT is the battery pack 204, the excitation signal is the current excitation signal implemented by the battery monitoring system 202 controlling the FET 222 (e.g., responsive to the Ipwm signal). In this example, the measured parameter is a voltage response signal, such as Vcell_hr_1 or Vcell_hr_2, which are determined according to Equation 1 and responsive to values provided by the battery voltage amplifier 232 and/or the battery voltage amplifier 246. In these examples, the droop component includes an estimation of a slope of the voltage droop, which indicates a magnitude of the voltage droop, and can be determined by the droop estimation circuit 210.

Figure 3:
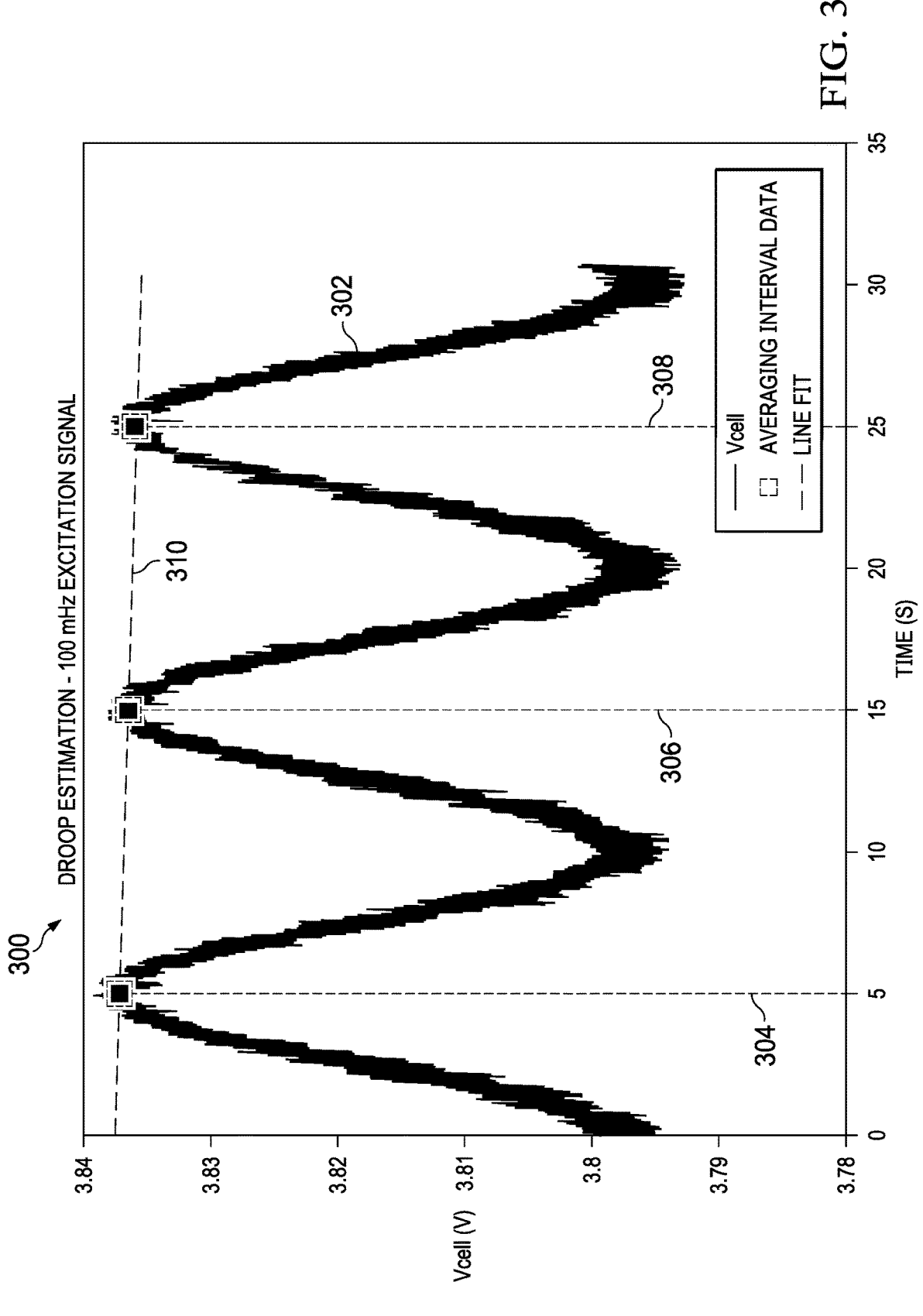
FIG. 3 is a graph of a waveform of a measured parameter of a device under test, which demonstrates estimating a droop component in an example.

FIG. 3 is a graph 300 of a measured parameter (e.g., Vcell represents one of the voltage response signals Vcell_1 or Vcell_2) as a function of time for the battery pack 204. In the graph 300, the voltage response signal 302 is responsive to a single-tone excitation signal having a frequency component of 100 mHz. The droop component of the voltage response signal 302 is determined or estimated in the time domain. As described, the variation of the OCV of the battery pack 204 due to voltage droop is approximately linear during a time period in which the current excitation signal is provided by the battery monitoring system 202. Accordingly, the droop component can be described by a slope and an offset of a line intersecting points having the same phase relative to the peaks of the sinusoidal response.

In some examples, a first value of the voltage response signal 302 is determined at a first time 304, at which the sinusoidal signal applied to the FET 222 has a particular phase value. One or more additional values of the voltage response signal 302 are determined at subsequent times, such as times 306, 308, that have phase values that are equal to or approximately equal to (e.g., within 10 percent of) the phase value at time 304. In one example, the time interval between each pair of consecutive measurement times (e.g., from time 304 to 306) is equal to the period of the voltage response signal 302. In a case in which there is no voltage droop, the slope of the voltage droop is zero, and the value of the voltage response signal 302 at times having approximately equal phase values would be approximately the same.

However, in examples in which voltage droop is present, the value of the voltage response signal 302 at times having approximately equal phase values (e.g., times 304, 306, 308) decreases according to the slope of the voltage droop. For example, because the PWM excitation signal is periodic, k points spaced apart by the period (e.g., having approximately equal phase values) form a line having a slope of the voltage droop. In the example of FIG. 3, k=3; however, in other examples, k is greater than or less than 3. Accordingly, a line 310 is fit (e.g., by a least-square line fit, or another line-fitting method) to the voltage response signal 302 values at times 304, 306, 308, at which the voltage response signal 302 (e.g., the measured parameter) has approximately equal phase values. In some examples, the times 304, 306, 308 do not fall exactly on a sampling point of the voltage response signal 302. In such examples, nearby (e.g., closest-available) samples of the voltage response signal 302 are averaged or otherwise interpolated to generate values from which to fit the line 310. The following equations are one example of determining the values of the voltage response signal 302 and fitting a line, such as the line 310, based on those values.

An initial time from which the fitted line 310 is determined is given by $t_o$. In this example, for a voltage response signal 302 having a DFT bin index k, a vector of interpolation times (e.g., times 304, 306, 308, etc.) is given by:

$$t^T = [t_o \ t_o + T_k \ldots t_o + (k-1)T_k].\tag{4}$$

The period of the PWM excitation signal, and the voltage response signal 302, is given by T $k = T_S N_{dft}/k$, where $N_{dft}$ is the length of the DFT block size in samples, and $T_S$ is a sampling period (e.g., of an analog-to-digital converter (ADC) of the battery monitoring system 202) in seconds. As described, the values of the voltage response signal 302 that are interpolated at these times 304, 306, 308 are determined by averaging samples in a window around the time 304, 306, 308. The parameter $N_{win}$ gives the length of the averaging window around the interpolation time 304, 306, 308.

For example, for an interpolation time location $t_q = t_o + qT_k$, the estimated value of the voltage response signal 302 is:

$$v_q = \Sigma_{n=a}^{b} v_{cell}[n]/N_{win}\tag{5}$$

The summation limits in Equation 5 are given by $$a = \left\lfloor (t_o + qT_k)/T_S \right\rfloor - \left\lfloor \frac{N_{win}}{2} \right\rfloor + 1 \text{ and } b = a + N_{win} - 1.$$

The notation $\lfloor x \rfloor$ represents the largest integer less than or equal to x. The first term in the expression for a gives the closest ADC sampling instant to $t_q$. The additional terms enable there being $\lfloor N_{win}/2 \rfloor$ samples less than or equal to $t_q$ in the averaging window. In the case where $N_{win}$ is even and $t_q$ does not fall on an ADC sampling location, there are an equal number of samples on either side of $t_q$ in the averaging window. In some examples, the averaging procedure applies a weighted sum of the ADC samples in the averaging window. The computed averaged samples can be grouped together in a vector for notational convenience. This vector of interpolation voltages is:

$$v^T = [v_0 \ldots v_{k-1}].\tag{6}$$

As described, the fitted line 310 can be represented by a linear equation. In this example, the signal model for the fitted line 310 is given by:

$$v = \begin{bmatrix} t & c \end{bmatrix} \begin{bmatrix} m \\ b \end{bmatrix} + w,\tag{7}$$

where m is the slope of the line, b is the y-intercept, w represents noise in the data, and $c^T = [1 \ldots 1]$, or a constant vector of dimension k.

In an example, an estimate of m and b is derived from a least-squares line fitting calculation. For example, the slope and offset estimates are given by:

$$\begin{bmatrix} \hat{m} \\ \hat{b} \end{bmatrix} = \frac{1}{(t^T t)(c^T c) - (c^T t)^2} \begin{bmatrix} (c^T c)(t^T v) - (c^T t)(c^T v) \\ (c^T v)(t^T t) - (c^T t)(t^T v) \end{bmatrix}.\tag{8}$$

Given the estimates for slope and offset from Equation 8, the DFT of the linearly varying OCV signal (e.g., the fitted line 310 in FIG. 3) can be determined (e.g., as D[k]) and subtracted from V[k], which is the DFT of bin k of the voltage response signal 302. In examples of this description, frequency domain representation of the voltage response signal 302 (e.g., V[k]) is corrected by applying (e.g., subtracting) the DFT of the OCV signal (e.g., D[k]) for the DFT bin(s) containing excitation signal energy (e.g., the DFT bins that correspond to the frequency component(s) of the current excitation signal provided to generate the voltage response signal 302). In these examples, the frequency response due to the offset $\hat{b}$ from Equation 8 is confined to the constant bin k=0. This bin does not carry excitation signal energy, and can be ignored. The interference in the remaining DFT bins is determined by the linear variation sequence d[n]=mT$_s$n. The DFT for any bin index k can be computed, such as by determining the resulting correction based on the slope estimate $\hat{m}$ (e.g., as determined in Equation 8), which is given by:

$$D[k] = \begin{cases} \hat{m}T_s \dfrac{N(N-1)}{2}, & k = 0 \\ \dfrac{-\hat{m}NT_s}{2}\left(1 + j\cdot\cot\left(\dfrac{\pi k}{N}\right)\right), & k \neq 0 \end{cases} \qquad (9)$$

The foregoing provides one example of determining the values of the voltage response signal 302 for certain times (e.g., times 304, 306, 308), fitting a line 310 based on those values, and determining a frequency domain representation (e.g., a DFT) of a droop component, such as the slope of a voltage droop of the voltage response signal 302. Subsequently, a frequency domain representation of the voltage response signal 302 is corrected at a certain frequency (e.g., DFT bin(s), or a range of frequencies) by applying or subtracting the frequency domain representation of the droop component at that frequency. The frequency at which the frequency domain representation of the voltage response signal 302 is corrected corresponds to the frequency component(s) of the current excitation signal provided to generate the voltage response signal. For example, the corrected value for the voltage response signal at bin k is V'[k]=V[k]−D[k], where k is selected to include the frequency component(s) of the excitation signal. In these examples, the frequency domain representation of the voltage response signal 302 is corrected by the droop correction circuit 212.

FIG. 4 is a block diagram of a system 400 to compensate for a droop component in a measured parameter of a DUT, such as battery pack 204. The system 400 in FIG. 4 includes circuit(s) that provide functionality similar to battery monitoring system 202 (e.g., signal generation circuit 207, and impedance spectroscopy circuit 208), as described. For example, an excitation signal (e.g., implemented by controlling the FET 222) is provided by the signal generation circuit 207. In FIG. 4, x(t) represents a function of an excitation signal implemented by the PWM signal. A battery impedance sense circuit 402 provides time domain representations of current provided by the battery pack 204, including the measured parameters Iload(t) and Ipwm(t), responsive to the providing of the excitation signal to the battery pack 204. The battery impedance sense circuit 402 also provides time domain representations of battery pack 204 voltage, including the measured parameters Vac(t) and Vcell(t), responsive to the excitation signal being provided to the battery pack 204. As described, the current through the current measurement path is indicated to the battery monitoring system 202 as Ipwm, and the voltage across the battery pack 204 is indicated to the battery monitoring system 202 as Vac_1 and Vac_2, from which Vcell_hr(t) is determined as described above, such as with respect to Equation 1. Accordingly, the battery impedance sense circuit 402 in FIG. 4 provides the time domain representations of various parameters measured by the battery monitoring system 202, described above with respect to FIG. 2.

The time domain representations of voltage and current are provided to filter/sample circuit 404. The filter/sample circuit 404 is configured to remove noise (e.g., providing a low-pass filter). The filter/sample circuit 404 is also configured to sample Iload(t), Ipwm(t), Vac(t), and Vcell(t), and to convert those sampled, or discrete, analog values to digital values in some cases (e.g., providing an ADC function). The filter/sample circuit 404 is also configured to determine or derive Icell[n] and Vcell_hr[n] from the discrete values. For example, Vdac is determined responsive to the RMS value of the Vcell signal, and Vcell_hr[n] is then determined according to Equation 1, above. Icell[n] is determined according to Equation 2, above. Irrespective of whether the discrete values are analog or digital values, those discrete values are labeled Icell[n] and Vcell_hr[n], respectively.

In some examples, transient circuit 406 is provided to remove transient responses from the output of the filter/sample circuit 404, such as those associated with the RC stages 106 of the battery pack 204. For example, the transient circuit 406 is configured to wait a period of time to begin providing samples to a subsequent stage, or to discard a first number of samples, such as to allow a transient to settle before providing those samples to a subsequent stage.

In certain examples, window circuit 408 is provided to select a number of consecutive samples from the output of the transient circuit 406 to be processed by a subsequent stage.

Irrespective of the functionality performed by the circuit 404, 406, 408, Icell[n] and Vcell_hr[n] are provided to frequency transform circuit 410, which applies a mathematical transform (e.g., a DFT) to transform the time domain current and voltage signals, Icell(t) and Vcell_hr(t), to frequency domain current and voltage signals, Icell[k] and Vcell_hr[k], respectively.

In the example of FIG. 4, the time domain voltage signal, Vcell_hr[n], is also provided to a droop estimation circuit 412, which determines a droop component of Vcell_hr[n]. For example, the droop estimation circuit 412 determines a slope of the voltage droop present in Vcell_hr[n] as the droop component. As described, the slope of the voltage droop is determined responsive to values of the measured parameter of the DUT, or the voltage of the battery pack 204 in this example. The values of the measured parameter are from at least first and second times, at which the measured parameter has equal or approximately equal phase values. As described with respect to FIG. 3, the values of the voltage response signal 302 are determined at times 304, 306, 308, and a slope of the fitted line 310 for those values is thus determined.

The determined droop component, such as the slope of the voltage droop present in Vcell_hr[n], is provided by the droop estimation circuit 412 to a droop correction circuit 414, which determines or computes a frequency domain representation of the droop component (e.g., D[k], as described with respect to Equations 8 and 9.

The droop correction circuit 414 also includes, or is coupled to, an adder 415 that applies (e.g., subtracts) the droop component, D[k], to the frequency domain representation of the voltage parameter of the battery pack 204, Vcell_hr[k]. In an example, the excitation signal provided to the battery pack 204 (e.g., the current signal in this example) is provided at a first frequency, and thus includes a frequency component. The response signal (e.g., the voltage signal in this example) includes the same frequency component. In an example in which an impedance result, or spectra, of the battery pack 204, is determined responsive to a ratio of the voltage and current signals, the impedance spectra is determined responsive to a frequency range (e.g., a DFT bin) that includes the frequency component of the excitation or current signal, and of the response or voltage signal. Accordingly, the droop component is applied to the frequency domain representation of the voltage parameter of the battery pack 204 at the frequency of, or in a frequency range or DFT bin that includes, the frequency component of the response or voltage signal. Correcting for the interference that results from voltage droop is thus performed in the frequency domain, which simplifies the correction because it is performed in the frequency range(s) (e.g., DFT bin(s)) that include the frequency component of the excitation signal, and thus also the frequency component of the response signal.

For example, the frequency component of the excitation signal, and thus also the response signal, is given by k. In this example, the corrected response or voltage signal is given by V'cell_hr[k]=Vcell_hr[k]−D[k]. The corrected voltage signal is provided to a divider 416. The frequency domain representation of the current signal, in the same DFT bin k, or Icell[k], is also provided to the divider 416. The divider 416 is thus configured to determine the battery pack 204 impedance spectra by dividing V'cell_hr[k] by Icell[k].

Figure 5:
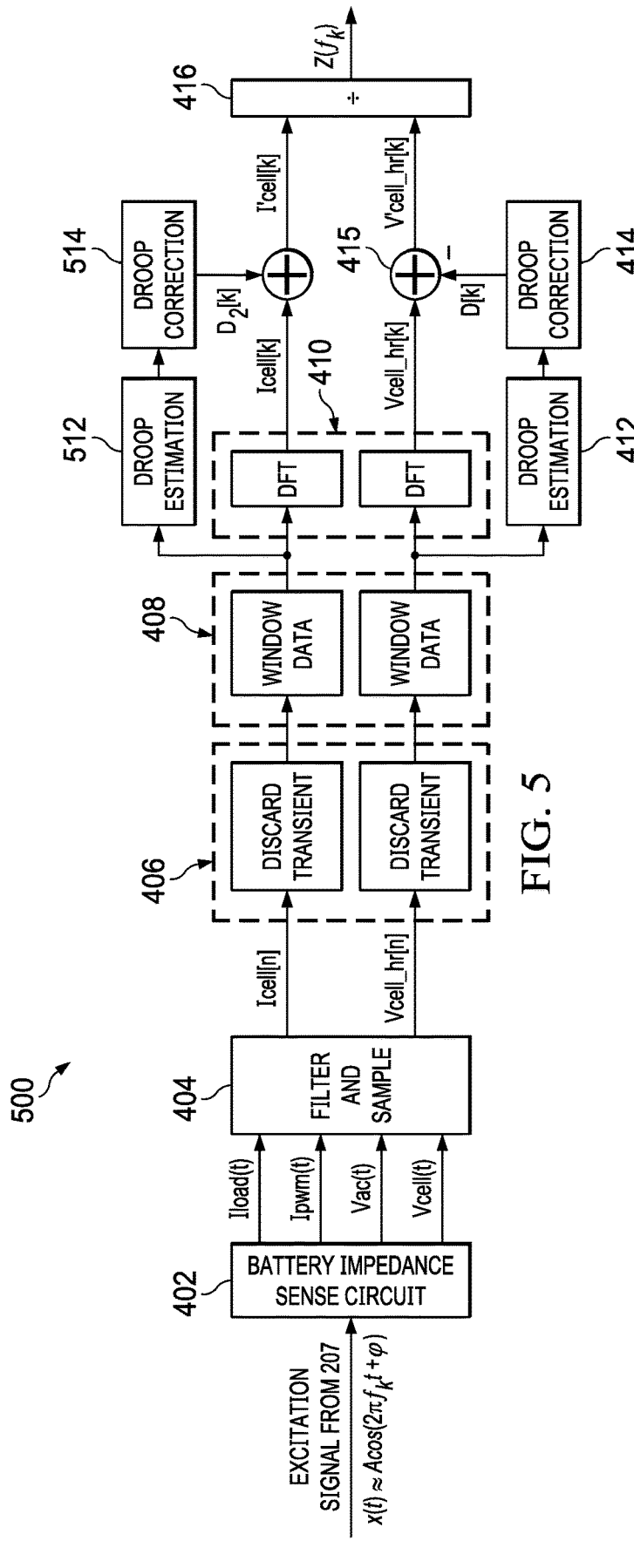
FIG. 5 is a block diagram of a system to compensate for a droop component in a measured parameter of a device under test, and in an excitation signal provided to the device under test, in an example.

FIG. 5 is a block diagram of a system 500 to compensate for a droop component in an excitation signal applied to a DUT, such as battery pack 204, and also compensating for the measured parameter as described with respect to FIG. 4. The system 500 in FIG. 5 includes components of the system 400, such as battery impedance sense circuit 402, filter/sample circuit 404, transient circuit 406, window circuit 408, frequency transform circuit 410, droop estimation circuit 412, droop correction circuit 414, adder 415, and divider 416. These components function as described and are not described again with respect to FIG. 5 for the sake of brevity.

In addition to the components from FIG. 4, the system 500 in FIG. 5 includes circuits that correct a frequency domain representation of the excitation signal (e.g., Icell(t) or Icell[n] being the excitation signal). Because the current provided by the battery pack 204 is dependent on the battery pack 204 voltage (e.g., the battery pack 204 voltage divided by the resistance of resistors 226, 228), the droop component in Vcell(t) causes a droop component in Icell(t).

Accordingly, in FIG. 5, the time domain current signal, Icell[n], is also provided to a droop estimation circuit 512, which determines a droop component of Icell[n] (e.g., a second droop component, where the droop component of Vcell_hr[n] is a first droop component). For example, the droop estimation circuit 512 determines a slope of the current droop present in Icell[n] as the second droop component. The slope of the current droop is determined similarly to the slope of the voltage droop, and is responsive to values of the excitation signal provided to the DUT, or the current provided by battery pack 204 in this example. The values of the excitation signal are from at least first and second times at which the excitation signal has equal or approximately equal phase values. The values of a current excitation signal are similar to the values of the voltage response signal 302 as described, and the current excitation signals are determined at multiple times (similar to times 304, 306, 308), and a slope of a fitted line (similar to fitted line 310) for those values is thus determined.

The determined second droop component, such as the slope of the current droop present in Icell[n], is provided by the droop estimation circuit 512 to a droop correction circuit 514, which determines or computes a frequency domain representation of the droop component (e.g., D₂[k]), as described with respect to Equations 8 and 9.

The droop correction circuit 514 also includes, or is coupled to, an adder 515 that applies (e.g., subtracts) the droop component, D₂[k], to the frequency domain representation of the current provided by the battery pack 204, Icell[k]. As described, the excitation signal includes a frequency component. The impedance spectra of battery pack 204 is determined responsive to a frequency range (e.g., a DFT bin) that includes the frequency component of the excitation or current signal, and of the response or voltage signal. Accordingly, the droop component D₂[k] is applied to the frequency domain representation of the excitation signal (e.g., current provided to the battery pack 204) at the frequency of, or in a frequency range or DFT bin that includes, the frequency component of the excitation signal. Correcting for the interference that results from current droop, which is responsive to the battery pack 204 voltage droop, is thus performed in the frequency domain, which simplifies the correction because it is performed in the frequency range(s) (e.g., DFT bin(s)) that include the frequency component of the excitation signal.

For example, the frequency component of the excitation signal is given by k. In this example, the corrected excitation signal is given by I'cell[k]=Icell[k]−D₂[k]. The corrected excitation signal is provided to the divider 416. In the example of FIG. 5, the divider 416 is thus configured to determine the battery pack 204 impedance spectra by dividing V'cell_hr[k] by I'cell [k].

FIG. 6 is a graph 600 of a measured parameter (e.g., Vcell_hr) or an excitation signal (e.g., Ipwm) as a function of time for the battery pack 204. The graph 600 is similar to the graph 300 of FIG. 3, with multiple droop components determined for the signal 602. At lower excitation frequencies, the period of the excitation signal, and the resultant measured parameter, can be on the order of 1,000s of seconds. Accordingly, a relatively low number of periods are performed to improve testing efficiency. To improve accuracy of the calculation of the droop component, multiple phase values are used to estimate the droop component.

In the example of FIG. 6, five lines I1-I5 are calculated for (e.g., fit to) the signal 602, similar to the line 310 in FIG. 3. Similar to FIG. 3, each of the lines I1-I5 can be described by a slope and an offset of a line intersecting points having the same phase relative to the peaks of the sinusoidal response. However, in FIG. 6, the phase value used to determine each line I1-I5 is different. For example, each line I1-I5 is determined by its initial interpolation time. For line l, where 0≤l≤L−1, the initial interpolation time is $t_{l0}$. The vector of interpolation times for this line is given by:

$$t_l^T=[t_{lo} \ t_{lo}+T_k \ \ldots \ t_{lo}+(k-1)T_k] \quad (10)$$

An estimated value of the voltage response signal 602 for a particular interpolation time location is determined as described above in Equation 5, with similar summation limits. A vector of interpolation voltages can also be calculated for the line l, as described above in Equation 6. However, in the example of FIG. 6, a signal model for a multi-line fit determines a common slope parameter for each line (e.g., lines I1-I5), and a separate offset parameter. In an example, a linear system that relates the slope and offset parameters to the measurements in block-matrix form is:

$$\begin{bmatrix} v_0 \\ v_1 \\ \vdots \\ v_{p-1} \end{bmatrix} = \begin{bmatrix} t_0 & c & 0 & \ldots & 0 \\ t_1 & 0 & c & \ldots & 0 \\ \vdots & \vdots & \vdots & \ddots & \vdots \\ t_{p-1} & 0 & 0 & \ldots & c \end{bmatrix} \begin{bmatrix} m \\ b_0 \\ b_1 \\ \vdots \\ b_{p-1} \end{bmatrix} + w. \quad (11)$$

The constant vector of dimension k is denoted $c^T=[1 \ \ldots \ 1]$, as above. The zero vector of dimension k is written as 0, also as above. The parameter m represents a common slope of all the lines, and $b_l$ represents the offset of line l. The vector w represents noise.

In an example, a least-squares estimate of the slope m is determined responsive to an inverse on the block matrix in Equation 11. In this example, offset parameter estimates are discarded prior to compensation and thus are not computed. The slope parameter is estimated by:

$$\hat{m} = \frac{\sum_{l=0}^{L-1}\left[(c^T c)(t_l^T v_l) - (c^T t_l)(c^T v_l)\right]}{\sum_{l=0}^{L-1}\left[(c^T c)(t_l^T t_l) - (c^T t_l)^2\right]}. \tag{12}$$

Accordingly, the DFT of a droop component of the voltage response signal 602 can be determined (e.g., as D[k], above) and subtracted from V[k], which is the DFT of bin k of the voltage response signal 602 itself.

In the example of FIG. 6, the droop component is determined responsive to data from multiple lines. For example, the line l1 is determined responsive to a first value of the signal 602 at a first time, which has a first phase value. One or more additional values of the signal 602 are determined at a subsequent time (e.g., a second time), which has a second phase value that is approximately equal to the first phase value. Continuing this example, the line l2 is determined responsive to a third value of the signal 602 at a third time, which has a third phase value. One or more additional values of the signal 602 are determined at a subsequent time (e.g., a fourth time), which has a fourth phase value that is approximately equal to the first third value. The third and fourth phase values are different than the first and second phase values. In some examples, additional lines (e.g., l3-l5) are determined in a similar manner.

A resulting droop component is determined responsive to the lines (e.g., l1 and l2), such as the slope according to Equation 12 above. The resulting droop component is then applied to correct the frequency domain representation(s) of the excitation signal and/or the measured parameter, similar to described above in the examples of FIGS. 3-5.

FIG. 7 is a flow chart of a method 700 of compensating for a droop component in a measured parameter of a DUT, such as the battery pack 204. In some examples, the method 700 is performed by the battery monitoring system 202, including the droop estimation circuit 210 and the droop correction circuit 212, described above. In other examples, the method 700 is performed by a hardware processor (of the battery monitoring system 202) responsive to executing instructions (e.g., stored in a non-transitory, computer-readable medium, such as a memory).

The method 700 begins in block 702 with providing an excitation signal to the DUT. The excitation signal includes a frequency component. In an example, the excitation signal is the PWM current excitation signal described above, which controls the operation of the FET 222 to regulate current through the current measurement path including resistors 226, 228. Because the current through the current measurement path is drawn from the battery pack 204, the battery pack 204 is thus excited by the current excitation signal PWM. In one example, the current excitation signal is a single sinusoidal signal (e.g., the excitation signal is a single-tone signal and has a single frequency component). In another example, the current excitation signal is a linear combination of sinusoidal signals (e.g., the excitation signal is a multi-tone signal and has multiple frequency components).

The method 700 continues in block 704 with measuring a parameter of the DUT that is responsive to the excitation signal. As described above, the measured parameter can be a voltage across the battery pack 204 or battery cells 205, 206 that are included in the battery pack 204. In an example, a high-resolution voltage (Vcell_hr) is determined responsive to measurements from the battery pack 204 or battery cells 205, 206, and thus is also a measured parameter.

The method 700 then continues in block 706 with determining a droop component of the measured parameter. The droop component is determined responsive to a first value of the measured parameter at a first time and a second value of the measured parameter at a second time. A phase value of the measured parameter at the first time is equal to a phase value of the measured parameter at the second time. As described with respect to FIG. 3, the droop component includes an estimation of a slope of the voltage droop, which indicates a magnitude of the voltage droop. In some examples, the droop component of the parameter (e.g., voltage response signal 302) is determined or estimated in the time domain. The variation of the OCV of the battery pack 204 due to voltage droop is approximately linear during a time period in which the current excitation signal is provided by the battery monitoring system 202. Accordingly, the droop component can be described by a slope and an offset of a line intersecting points having the same phase relative to the peaks of the sinusoidal response, which can be determined as described with respect to FIG. 3.

The method 700 continues in block 708 with correcting a frequency domain representation of the parameter by applying the droop component at a frequency of the representation of the parameter corresponding to the frequency component of the excitation signal. For example, a frequency domain representation (e.g., a DFT) of the droop component is determined as in Equation 9. The frequency domain representation of the parameter (e.g., voltage response signal 302) is corrected at a certain frequency (e.g., DFT bin(s), a specific frequency, or a range of frequencies) by applying or subtracting the frequency domain representation of the droop component at that frequency. The frequency at which the frequency domain representation of the parameter is corrected corresponds to the frequency component(s) of the current excitation signal provided to generate the voltage response signal. For example, the corrected value for the voltage response signal at bin k is V'[k]=V[k]−D[k], where k is selected to include the frequency component(s) of the excitation signal.

Figure 8:
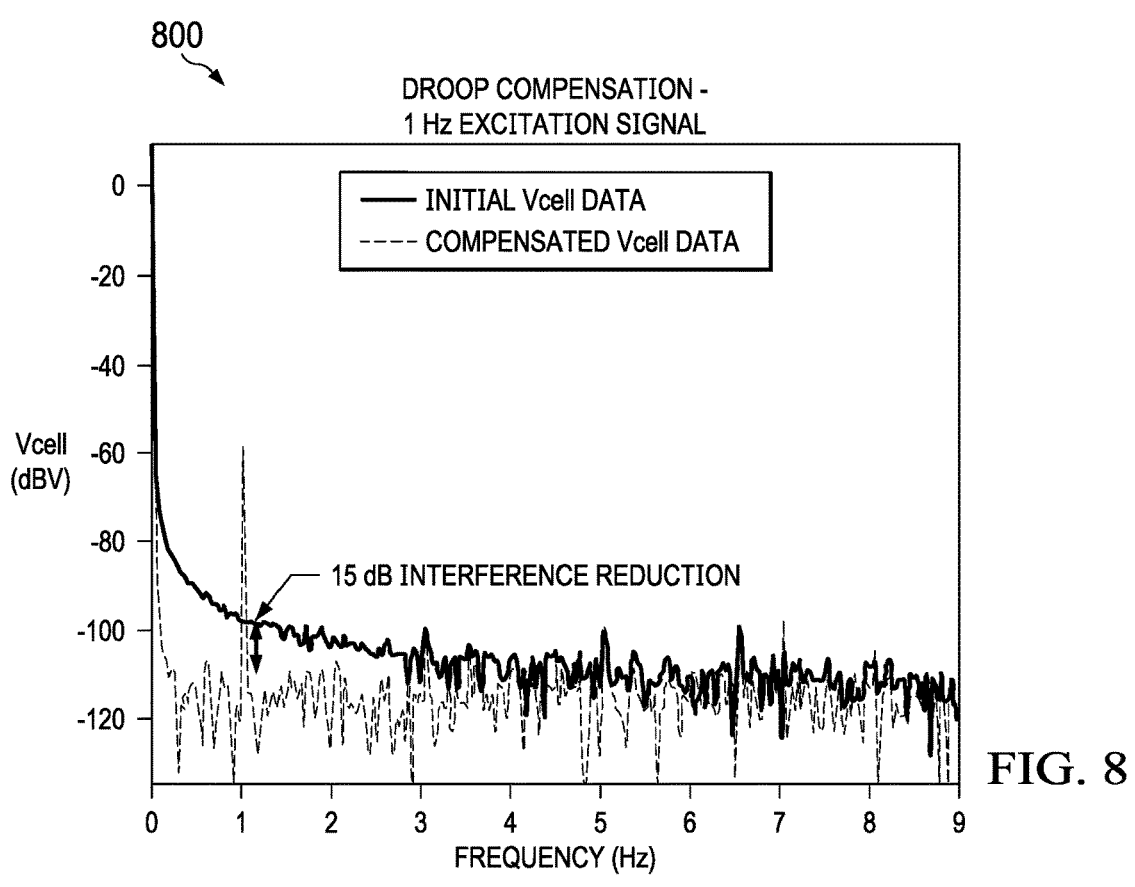
FIG. 8 is a graph of the power spectra for measured parameter waveforms demonstrating a reduction in interference that results from using droop compensation systems and methods in an example.

FIG. 8 is a graph 800 of power spectra demonstrating a reduction in interference that results from using droop compensation systems and methods in an example. The graph 800 is in units of decibel-Volts (dBV) as a function of frequency, responsive to a 1 Hz excitation signal (e.g., Ipwm in FIG. 2). As described above, in examples in which a droop component is present in DUT measured parameters, DFTs of such parameter(s) include spectral leakage. Spectral leakage in the voltage and/or current DFTs reduces the accuracy of the determination of the DUT (e.g., battery pack 204) impedance spectra, or EIS measurements, and subsequent processing of those EIS measurements.

In the example of FIG. 8, the initial Vcell data is not compensated for a droop component in a measured parameter of a DUT, such as the battery pack 204. However, the compensated Vcell data represents the application of the examples of this description to compensate for the presence of a droop component, such as described above with respect to FIGS. 2-6. Accordingly, while both the initial and compensated Vcell data waveforms contain a strong frequency response at 1 Hz (e.g., because of the 1 Hz excitation signal), the compensated Vcell data waveform has reduced spectral leakage in surrounding frequencies, such as an approximate 15 dB interference reduction in frequencies around 1 Hz, relative to the initial Vcell data.

Figure 9:
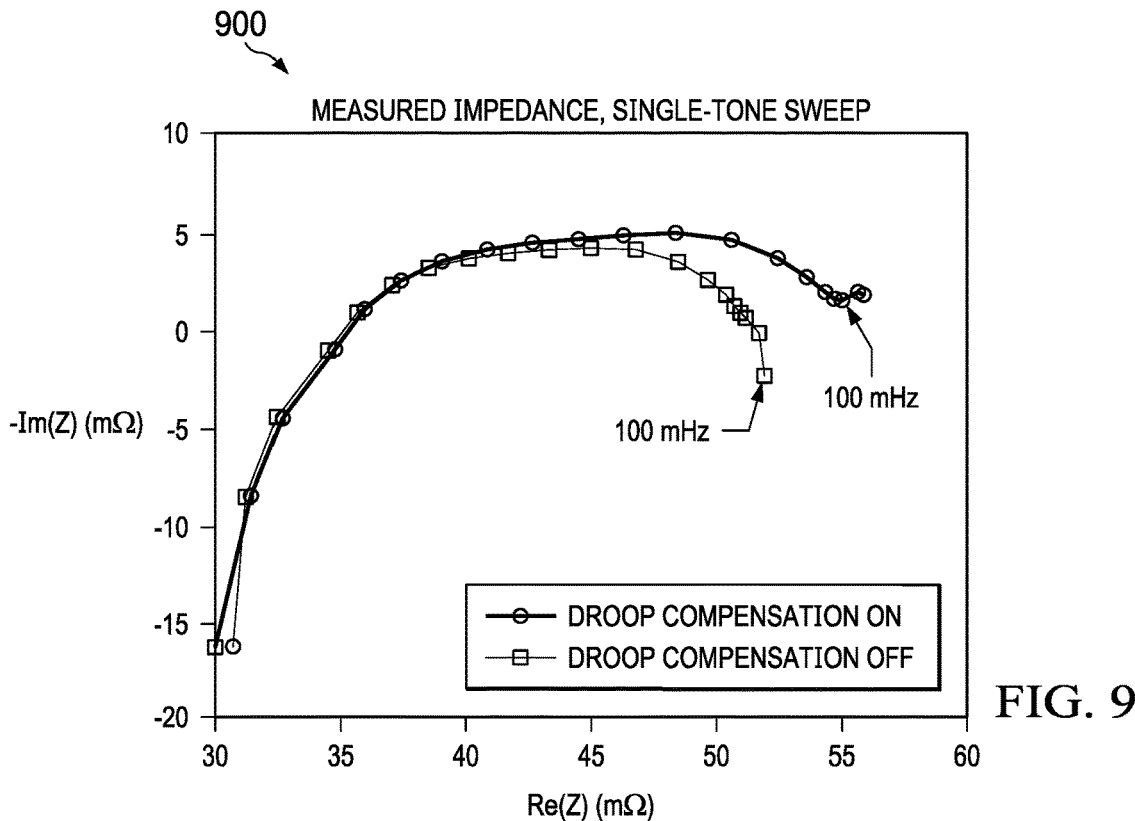
FIG. 9 is a graph comparing impedance spectrum estimates of a device under test with and without using droop compensation systems and/or methods in an example

FIG. 9 is a graph 900 comparing impedance spectrum estimates of a device under test (e.g., the battery pack 204) with and without using droop compensation systems and/or methods in an example. The graph 900 includes an uncompensated battery impedance curve (e.g., droop compensation off), and a compensated battery impedance curve (e.g., droop compensation on). The y-axis of the graph 900 represents an imaginary part of the impedance value multiplied by −1, while the x-axis of the graph 900 represents a real part of the impedance value. The curves each represent impedance values as a function of frequency (e.g., determined responsive to a frequency sweep of an excitation signal, such as Ipwm). The compensated battery impedance curve represents the application of examples of this description to compensate for the presence of a droop component, such as described above with respect to FIGS. 2-6. The graph 900 demonstrates that the determined impedance, particularly at lower frequencies (e.g., the frequency values ending at 100 mHz), is affected by the application of droop compensation in examples of this description. For example, y-axis values without compensation are negative, which is not characteristic of a battery impedance curve. However, after droop compensation, the y-axis values at low frequency are positive, and the beginning of a characteristic arc or "hump" for a low-frequency time constant becomes visible. Accordingly, the accuracy of the battery impedance curve is improved by applying the droop compensation examples described herein.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitor, respectively, coupled in parallel between the same nodes. For example, a resistor or capacitor shown and described herein as a single component may instead be multiple resistors or capacitor, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A method, comprising:
transforming a signal from a first domain representation to a second domain representation, the signal representing a parameter of a device and having multiple cycles;
determining the second domain representation of a droop component of the parameter, in which the droop component represents a rate of change of the parameter across one or more cycles of the multiple cycles; and
generating an adjusted parameter of the device responsive to combining the respective second domain representations of the parameter and the droop component.

2. The method of claim 1, wherein the signal is a first signal, and the method further comprises:
determining the second domain representation of an excitation signal, in which the parameter represents a response of the device to the excitation signal;
responsive to determining the second domain representation of the excitation signal, determining a first component of the parameter and a second component of the droop component, and
wherein generating the adjusted parameter of the device responsive to combining the respective second domain representations of the parameter and the droop component includes generating a third component of the adjusted parameter responsive to combining the first and second components.

3. The method of claim 2, wherein responsive to determining the second domain representation of the excitation signal, determining the first component of the parameter and the second component of the droop component includes:
determining, from the second domain representation of the excitation signal, a particular second domain bin; and
determining, from the second domain representation of the parameter, the first component associated with the particular second domain bin; and determining, from the second domain representation of the droop component, the second component associated with the particular second domain bin.

4. The method of claim 2, wherein determining the second domain representation of a droop component of the parameter includes:

determining, from the first domain representation of the parameter, a first value associated with a first time;

determining, from the first domain representation of the parameter, a second value associated with a second time; and determining the second domain representation of the droop component responsive to determining the first and second values.

5. The method of claim 4, wherein determining the second domain representation of the droop component includes determining a slope responsive to determining the first value and the second value, and wherein an amount of time between the first time and the second time is equal to an integer multiple of a period of the excitation signal.

6. The method of claim 5, wherein the slope is determined responsive to a least-square line fitting computation.

7. The method of claim 1, wherein the device includes a battery cell or a group of battery cells.

8. The method of claim 2, wherein the excitation signal includes at least one of a current signal or a voltage signal, and wherein the parameter includes at least one of:

a current conducted by the device, a voltage across the device, or an impedance of the device.

9. The method of claim 2, further comprising:

receiving samples of a current through the device or a voltage across the device; and identifying subsets of the samples in different windows; and determining the parameter responsive to averaging the subsets of the samples.

10. The method of claim 1, wherein the first domain representation is a time domain representation, and the second domain representation is a frequency domain representation.

11. A system, comprising:

a parameter determination circuit having a device input and a parameter output, the device input coupled to a device, and the parameter determination circuit configurable to transform a signal from a first domain representation to a second domain representation, and provide the second domain representation of the signal at the parameter output, the signal representing a parameter of a device and having multiple cycles;

a droop determination circuit having a first parameter input and a droop output, the first parameter input coupled to the parameter output, and the droop determination circuit configurable to provide the second domain representation of a droop component of the parameter at the droop output, in which the droop component represents a rate of change of the parameter across one or more cycles of the multiple cycles; and a parameter adjustment circuit having a second parameter input, a droop input, and an adjusted parameter output, the second parameter input coupled to the parameter output, the droop input coupled to the droop output, and the parameter adjust circuit configurable to provide an adjusted parameter of the device at the adjusted parameter output responsive to combining the respective second domain representations of the parameter and the droop component.

12. The system of claim 11, wherein:

the signal is a first signal;

the parameter determination circuit has a second domain bin output and configurable to:

determine the second domain representation of an excitation signal, in which the parameter represents a response of the device to the excitation signal;

responsive to determining the second domain representation of the excitation signal, provide a first component of the parameter associated with a particular second domain bin at the parameter output and a second signal representing the particular second domain bin at the second domain bin output; and the droop determination circuit has a second domain bin input coupled to the second domain bin output and configurable to provide a second component of the droop component associated with the particular second domain bin responsive to the second signal; and the parameter adjustment circuit is configurable to provide the adjusted parameter based generating a third component of the adjusted parameter associated with the particular second domain bin responsive to combining the first and second components.

13. The system of claim 12, wherein the first domain representation is a time domain representation, and the droop determination circuit is configurable to:

determine, from the time domain representation of the parameter, a first value associated with a first time;

determine, from the time domain representation of the parameter, a second value associated with a second time; and determine the second domain representation of the droop component responsive to determining the first and second values.

14. The system of claim 13, wherein the droop determination circuit is configurable to determine a slope responsive to determining the first value and the second value, and wherein an amount of time between the first time and the second time is equal to an integer multiple of a period of the excitation signal.

15. The system of claim 14, wherein the droop determination circuit is configurable to determine the slope responsive to a least-square line fitting computation.

16. The system of claim 11, wherein the device includes a battery cell or a group of battery cells.

17. The system of claim 12, wherein the excitation signal includes at least one of a current signal or a voltage signal, and wherein the parameter includes at least one of: a current conducted by the device, a voltage across the device, or an impedance of the device.

18. The system of claim 11, wherein the first domain representation is a time domain representation, and the second domain representation is a frequency domain representation.

19. A non-transitory computer-readable medium comprising instructions that, when executed by a processor, cause the processor to:

transform a signal from a first domain representation to a second domain representation, the signal representing a parameter of a device and having multiple cycles;

determine the second domain representation of a droop component of the parameter, in which the droop component represents a rate of change of the parameter across one or more cycles of the multiple cycles; and generate an adjusted parameter of the device responsive to combining the respective second domain representations of the parameter and the droop component.

20. The non-transitory computer-readable medium of claim 19, further comprising instructions that, when executed by the processor, cause the processor to:

determining the second domain representation of an excitation signal, in which the parameter represents a response of the device to the excitation signal;

responsive to determining the second domain representation of the excitation signal, determine a first component of the parameter and a second component of the droop component, and generate a third component of the adjusted parameter responsive to combining the first and second components.

21. The non-transitory computer-readable medium of claim 19, wherein the first domain representation is a time domain representation, and the non-transitory computer-readable medium further comprises instructions that, when executed by the processor, cause the processor to:

determine, from the time domain representation of the parameter, a first value associated with a first time;

determine, from the time domain representation of the parameter, a second value associated with a second time; and determine the second domain representation of the droop component responsive to determining the first and second values.

22. The non-transitory computer-readable medium of claim 19, wherein the first domain representation is a time domain representation, and the second domain representation is a frequency domain representation.

\* \* \* \* \*